United States Patent [19]

Patscheck et al.

[11] Patent Number: 5,600,092
[45] Date of Patent: Feb. 4, 1997

[54] SINGLE CONTACT SPRING

[75] Inventors: Max Patscheck, München; Dieter Schmalzl, Augsburg; Helmut Mensching, Neusäss, all of Germany

[73] Assignees: Siemens Nixdorf Informationssysteme Aktiengesellschaft, Paderborn; J. N. Eberle Federnfabrik GmbH, Schabmunchen, both of Germany

[21] Appl. No.: 343,569

[22] PCT Filed: May 19, 1993

[86] PCT No.: PCT/DE93/00440

§ 371 Date: Nov. 23, 1994

§ 102(e) Date: Nov. 23, 1994

[87] PCT Pub. No.: WO93/25062

PCT Pub. Date: Dec. 9, 1993

[30] Foreign Application Priority Data

| May 26, 1992 | [DE] | Germany | 42 17 436.8 |
| Aug. 7, 1992 | [DE] | Germany | 42 26 209.7 |

[51] Int. Cl.⁶ .................................................. H05K 9/00
[52] U.S. Cl. .................................. 174/35 GC; 174/35 R; 24/293
[58] Field of Search ............................ 49/492.1, 489.1, 49/503, 483.1, 490.2, 495.1, 496.1; 24/293–95; 257/659; 174/35 GC, 35 C, 35 R; 361/638, 649, 769, 787, 800, 816, 818; 439/816–826, 846, 847, 867, 907, 908, 760, 761, 816

[56] References Cited

U.S. PATENT DOCUMENTS

| 4,535,565 | 8/1985 | Erikson | 49/493 |
| 4,566,746 | 1/1986 | Hobson | 339/60 R |
| 4,720,273 | 1/1988 | Thole | 439/592 |
| 4,761,516 | 8/1988 | Reichert | 174/35 GC |
| 4,866,213 | 9/1989 | Lindsay | 174/35 GC |
| 5,124,889 | 6/1992 | Humbert et al. | 361/424 |
| 5,225,629 | 6/1993 | Garrett | 174/35 R |

FOREIGN PATENT DOCUMENTS

| 0447942 | 9/1991 | European Pat. Off. |
| 9112299 | 12/1991 | Germany. |

*Primary Examiner*—Bot L. Ledynh
*Attorney, Agent, or Firm*—Hill, Steadman & Simpson

[57] ABSTRACT

The invention relates to a single contact spring, especially for RF-screening of electronic devices, for latch-locking into sheet-metal apertures. The invention envisages, in a first embodiment, that the single contact spring includes a latch cage (14) and a resilient contact part (2) configured as a contact cup (6), the latch cage (1) is generally configured in a trough shape and, in its lower part, trapezoidally in cross-section, being open at its two front ends and being provided on its two longitudinal sides with two opposing cutouts (16). The top edge of the longitudinal side is angled-off outward and the contact cup (6) is held by means of an angled-off, resilient carrier part (14) fastened to one of the front ends. The advantage of this spring is that it can be mounted in one mounting direction and can be laterally traversed. The contact cup can also, in a further embodiment, be configured in a roof shape.

20 Claims, 3 Drawing Sheets

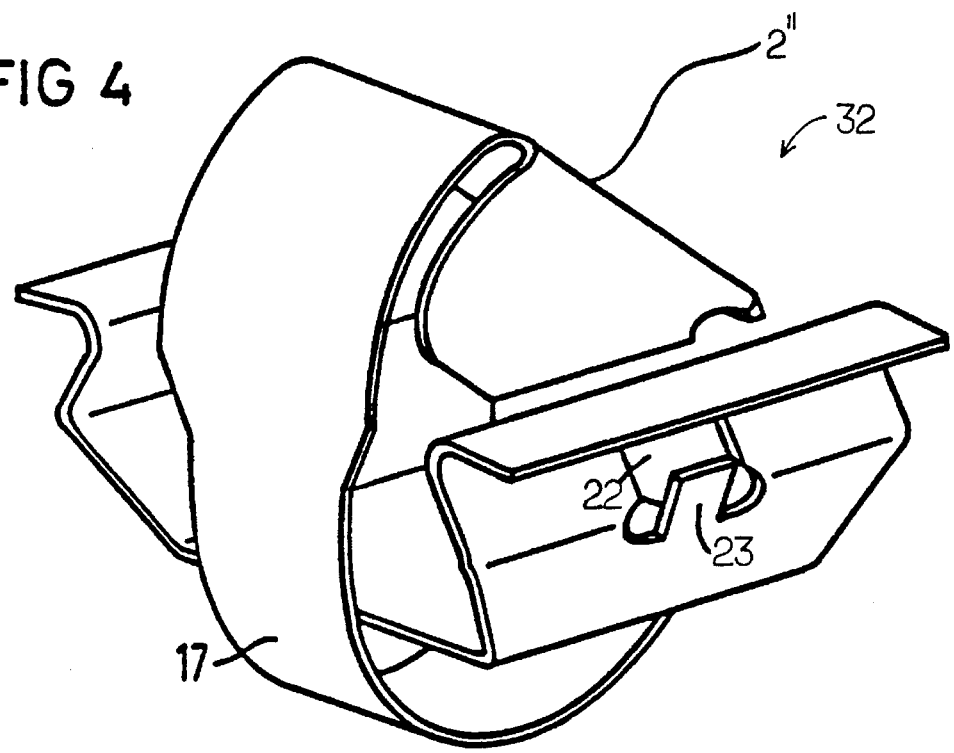
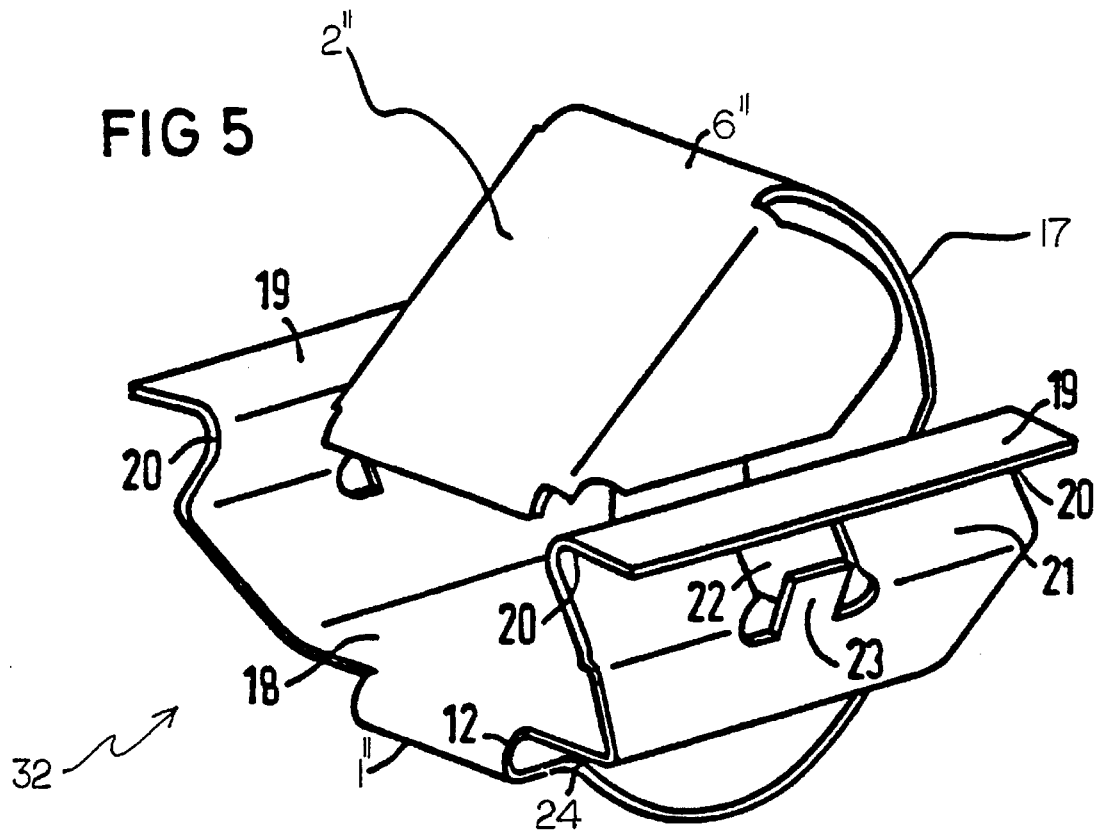

SINGLE CONTACT SPRING

BACKGROUND OF THE INVENTION

1. Field of the Invention

The invention relates to a single contact spring, especially for RF-shielding or RF-screening of electronic devices. More particularly, the present invention relates to such springs for latch-locking into sheet-metal apertures.

2. Description of the Related Art

Electrical devices must be screened such that high-frequency parasitic radiations can neither escape from the device nor enter the device. Screenings of this kind are realized, for example, for frontages of electronic devices, e.g. doors, side parts and roofs, and also for partitions which serve to separate screened and unscreened chambers. Such RF shielding devices or screening partitions are made from sheet metal and are provided with a metallic surface. Screenings of this kind are generally realized with springs, these springs latch-locking by complicated sequences of movements into sheet-metal apertures or different profiles such that the springs are permanently prevented, by positive engagement, from jumping out under mechanical loads. It is often difficult in this case to locate them in a mounting hole. Springs are also known which, made from contact strips, are stuck onto a contact surface. This fastening is problematical in terms of mounting methods and the holding requirements are only poorly met. Furthermore, springs of this kind should be designed such that they withstand transverse forces at a contact region under mechanical loads or during mounting. Furthermore, spring excursions, or deflection paths, in known spring systems are short and cannot, in the contacted state, be moved towards zero. Nor are they generally able to spring freely away to the rear and thereby exhibit, in the end state, high spring forces and friction noises relative to the initial contact. Contact elements of this type also generally require large graduation intervals.

SUMMARY OF THE INVENTION

The object of the present invention is to provide an individually mountable contact spring which latchlocks easily into an aperture in a sheet-metal blank and cannot be deformed beyond its elasticity threshold.

In order to achieve this object, the invention therefore provides for a single contact spring which is configured in such a way that it comprises a latch cage and a resilient contact part configured as a contact cup. The latch cage is configured generally as a channel or trough, having a lower part which is trapezoidal or rectangular in cross section. Furthermore, the latch cage is open at two ends and has two longitudinal sides, the sides having respectively opposing cutouts. The top edges of the longitudinal sides are angled-off outward, and the contact cup is held by means of an angled-off carrier part fastened to one of the ends. In one of the cutouts in the longitudinal sides there is disposed an outwardly bent-off elbow in which there engages a correspondingly opposite-bent, hook-shaped part, which is connected to the contact cup.

The contact cut can herein either be conically or pyramidally configured.

By virtue of these measures, a spring is obtained, the mounting of which is realized by pressure in a plug-in direction and which locates easily in a mounting hole. An automated mounting is thereby possible. This spring, by absorbing shock in the contact region, counteracts any transverse forces arising from mechanical action or generated upon movement or mounting of the fitted parts and is thereby secured against damage. It can be mounted, moreover, having small graduation intervals. The spring has a contact region that normally projects a large distance, but when the spring is contacted and compressed, the contact region recedes to nearly flush fit, or zero projection distance. The spring is able to deflect freely away to the rear, so that the motional forces, as the spring excursion increases, do not increase unnecessarily beyond the spring rate dictated by the shape and material type. The spring can be used both as a pressure contact and as a sliding contact. As a pressure contact it can be used on swivel doors, or as a sliding contact in inserts.

If the spring is intended to be able to be only bidirectionally traversed along the longitudinal direction, then the contact cup can also be configured in a roof shape.

In an embodiment, the contact cup is roof-shaped, having two roof slopes. One of the two roof slopes can continue into a convexly curved, resilient carrier part, which is connected to that front end of the latch cage lying opposite this roof slope, the carrier part running under the base of the latch cage.

In order to prevent lasting deformation or kinking of the resilient carrier part, the single contact spring of the present invention can also be configured such that the fastening of the carrier part to the opposing front end is realized by means of a loop-shaped configuration of the carrier part.

Part of the material to be removed for the realization of the opposing cutouts on the longitudinal sides of the latch cage can be left in place as tabs bent obliquely outward. This provides a simple protection for the single contact spring against it falling out of the latch hole.

In an embodiment, in order to increase the contact forces, the spring can also include, in the contact region of the contact cup, a domed embossment.

In order to prevent the spring jumping automatically out the sheet-metal aperture, latch bosses can also be provided at the cutouts in the longitudinal sides.

In an embodiment, a contact spring is provided having a contact part and a latch cage configured to snap-fit into an aperture. A resilient carrier part extends from the latch cage to the contact part. The carrier part biases the contact part generally away from the latch cage. An L-shaped elbow extends from the latch cage. A hook part extends from the contact part to normally engage the elbow, limiting movement of the contact part away from the latch cage, but allowing deflection of the contact part toward the latch cage.

In an embodiment, the contact part is generally conical and has a domed embossment.

In an embodiment, the contact part is generally roof-shaped, having two downwardly sloping portions forming a crest directed away from the latch cage.

In an embodiment, the contact spring includes a pair of latch bosses. Each latch boss extends generally outward and upward from sides of the latch cage. The latch bosses are resiliently deflectable and engageable with edges of the aperture to allow insertion of the contact spring into the aperture and resist removal of the contact spring from the aperture.

In an embodiment, the carrier part extends from the contact part at a first end and extends below said latch cage in a semicircular fashion. The carrier part joins the latch cage at a second end opposite the first end.

In an embodiment, the latch cage has two oppositely disposed longitudinal sides. The sides are configured to bias outwardly against the aperture to retain the contact spring therein.

In an embodiment, a contact spring for an RF-shielding device is provided. The contact spring includes a contact part and latch cage. The contact part is biased away from the contact part by a resilient carrier part. The latch cage is configured to fit into an aperture of said RF-shielding device. The latch cage is generally trough-shaped and includes a pair of oppositely disposed upwardly extending longitudinal sides. The contact part is movably located generally between the sides. The sides are configured to inwardly deflect upon engagement with the aperture so that the latch cage is receivable within the aperture. A cutout is provided in each side, and a latch boss is defined by each cutout. Each latch boss is engageable with the aperture to retain the latch cage in the aperture. A hook means engages the contact part. The hook means limits movement of the contact part away from the latch cage, but allows movement of the contact part toward the latch cage.

In an embodiment, the hook means includes an elbow extending from one of the longitudinal sides at the respective cutout. A cooperative, oppositely-directed hook-shaped part extends from the contact part and is positioned to engage the elbow.

Additional features and advantages of the present invention are described in and will be apparent from the detailed description of the presently preferred embodiments and from the drawings.

BRIEF DESCRIPTION OF THE DRAWINGS

The invention is explained in greater detail with reference to the illustrative embodiments according to FIGS. 1 to 5, in which:

FIG. 4 shows a further single contact spring from the front, FIG. 5 shows the single contact spring according to FIG. 4 from the rear side of the latch cage.

DETAILED DESCRIPTION OF THE PRESENTLY PREFERRED EMBODIMENTS

Figure 1:
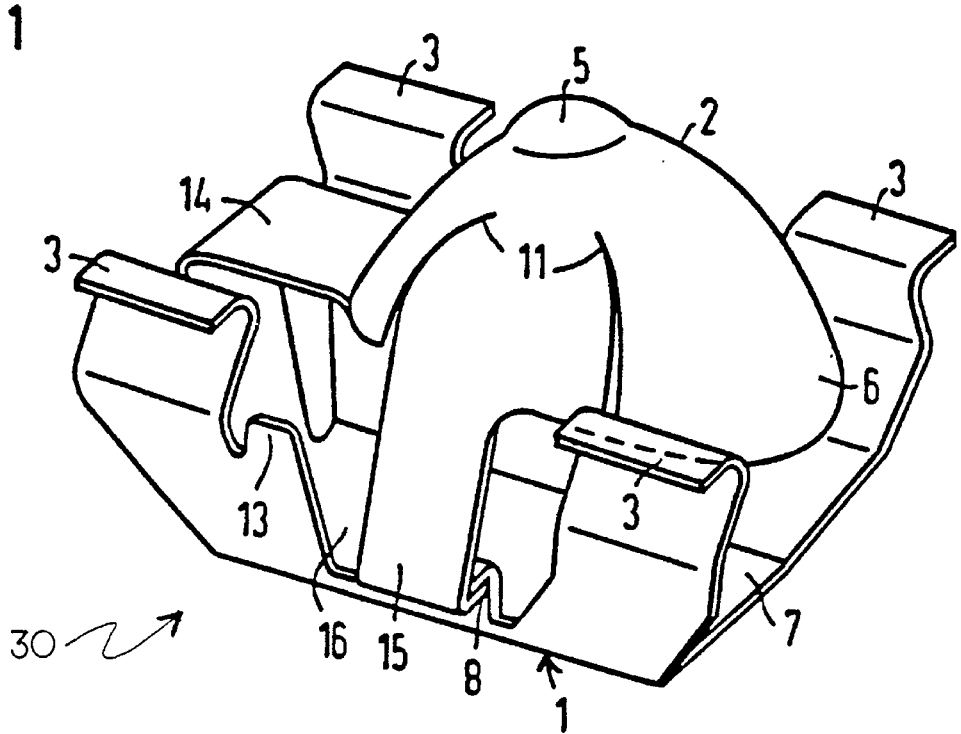
FIG. 1 shows a single contact spring having a conical contact cup.
Figure 2:
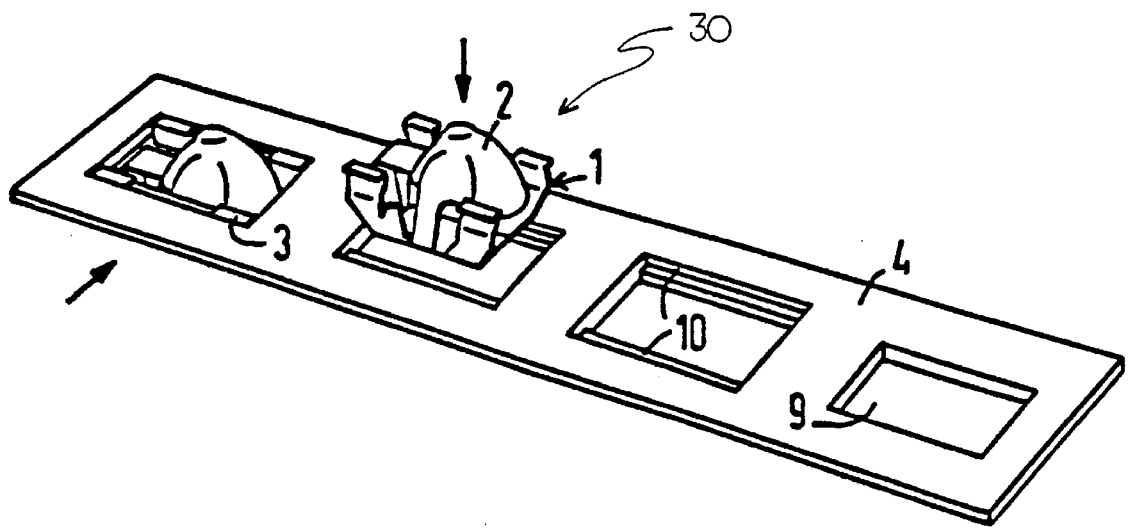
FIG. 2 shows single contact springs according to FIG. 1 in different states of insertion in the apertures provided.

A single contact spring 30 is provided, as illustrated in FIG. 1. The contact spring 30 includes a latch cage 1, which is generally trough-shaped, having a rectangular or trapezoidal lower part. The spring 30 also includes a contact part 2. In the embodiment illustrated in FIGS. 1 and 2, the contact part 2 includes a conical contact cup 6 which is preferably configured to have an upper contact zone with an additional domed embossment 5 for increasing the contact pressure. A conical roof 11 is held moreover by means of a carrier part 14 disposed on the front end of the trough-shaped latch cage. A further hook-like angled-off part 15, which is likewise connected to the conical roof 11 of the contact cup, serves to limit the spring excursion, or deflection path by engaging, with its bent-over part, a hook-like bent-off elbow 8 disposed in the cutout 16 and extending from the longitudinal side. The longitudinal sides of the latch cage are bent off outward on its top side to form bent-over borders 3 and thus serve as latch elements in the apertures 9, which apertures are provided, as shown in FIG. 2, in components into which the single contact springs are intended to be latch-locked.

The single contact spring 30 can be snapped into the rectangular sheet-metal apertures 9 in only one motional direction (press-button solution) and is anchored and fixed by virtue of its shape. In addition, it locates easily into the mounting holes 9. The bent-over borders 3 of the longitudinal sides of the latch cage herein form an overexpansion bearing surface. In addition, the spring is easily exchangeable, and exhibits a large spring excursion. At the same time, the spring 30 is relatively thin and makes little intrusion to the rear into the frontages of RF-shielding devices. This enables it to be used even in the case of thin frontages. The spring dives freely away to the rear under load and hence generates no additional counterforces. The contact cup 6 locates in the latch cage 1 a spring excursion limit 7 and is thereby prevented from becoming lastingly deformed. The spring excursion limit of the contact cup 6 in the upward direction simultaneously offers independence from the sheet-metal thickness of the mounting part, in that the maximum spring excursion is always available. A fundamental advantage of this spring is, moreover, that it requires for fastening only one aperture (contoured hole) 9, which, in the case of the general holes made in the sheet-metal parts, can be produced easily. If this contoured hole is fitted such that it skirts the frontage, then the frontage can be produced as a standard product and, depending upon the requirement for the built-in electronics, equipped with a greater or lesser number of springs. If the contoured hole, when it is stamped, receives in the same operation an embossment 10, the screening effect can be enhanced by the short distance between frontage and framework. Since the spring recesses fully into the embossment to be flush with the surface of the sheet-metal 4, the spring 30 can be laterally traversed on the surface.

The projecting contact part of the spring, which is configured as a conical cup, thereby absorbs transverse forces, in that the contact region of the spring springs away to the rear also under lateral mechanical load and slides along the opposing sheet-metal face without getting caught up. The spring is thereby particularly suitable for use in slide-in units which need to be screened against neighboring units. When the units are slid in, the spring can be traversed in any optional direction.

Figure 3:
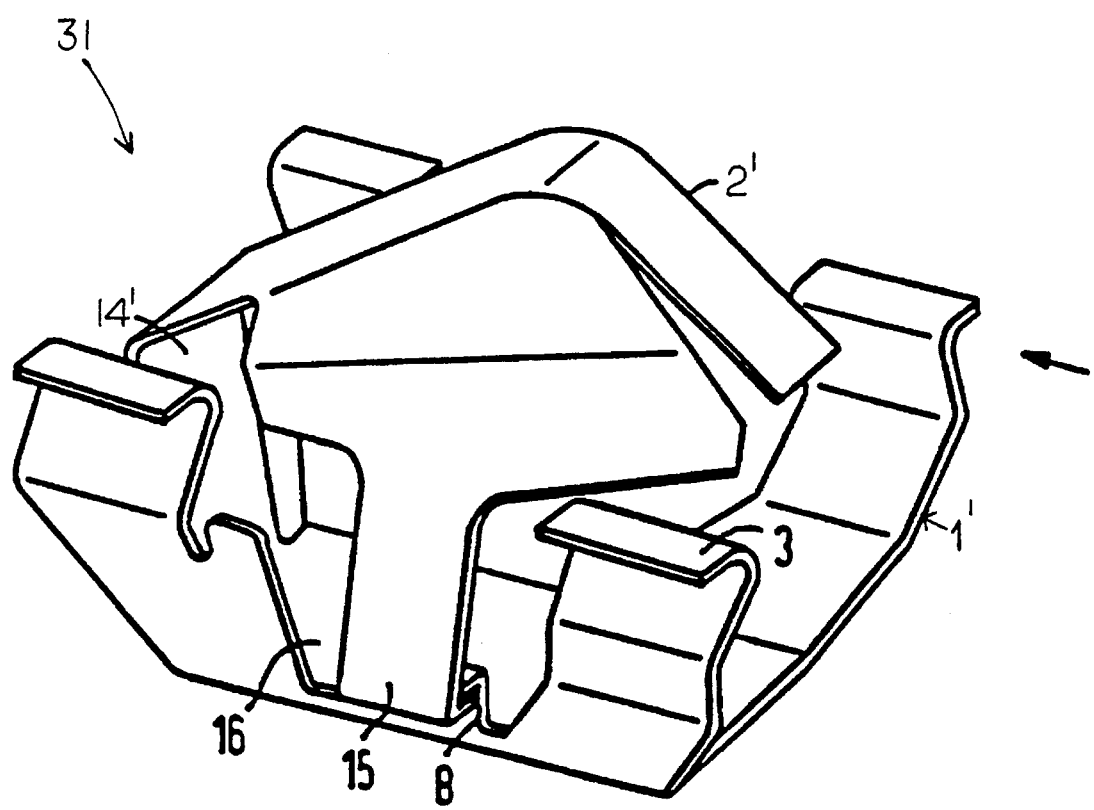
FIG. 3 shows a single contact spring having a roof-shaped contact cup.

In an embodiment, a projecting contact part 2' of the contact cup of a spring 31, as represented in FIG. 3, is constructed in a pyramidal shape or roof shape. The contact part 2' is held in a biased fashion by a resilient carrier part 14'. The spring 31 can be traversed, on both sides, only in the longitudinal direction. The direction in which the spring can be traversed, if the spring 31 and corresponding sheet-metal aperture are squarely configured, can be rotated by 90° during mounting. The advantage of this roof-shaped cup construction is an improved RF-screening resulting from linear or planar contact bearing.

Undesired unlatching of the spring is opposed by two latch bosses 13, which are located laterally in the latch cage and are supported against the rear side of the sheet-metal 4 containing the apertures 9. For conditions with no possibility of the spring being laterally traversed, the spring can also be more simply constructed.

A further embodiment of the present invention provides a single contact spring 32 having a roof-shaped contact part 2, as represented in FIGS. 4 and 5. A carrier part 17 is led through, as continuation of one roof slope of the roof-shaped contact part 2", in a long arc below a latch cage base 18 and connected to the base at the opposing end of the latch cage 9. This arcing allows finer spring latching coordination and lower contact forces and counteracts lasting deformation of the spring material. A lasting deformation or the kinking of the resilient carrier part 17 at the point of fastening is prevented by a loop-shaped configuration 12, 24 at the junction between the latch cage 1 and the carrier part 17. This design also contributes to the directional stabilization of the carrier part 17.

The spring 32 can be laterally traversed in two directions, by virtue of the spring carrier part 17 being rolled up and unrolled. The spring 32 can additionally be contacted from above.

With this design, a square latch hole configuration is also possible, so that the direction of traverse is thereby determined when the single spring 32 is mounted. The contact region of the cup 6" is of linear or slightly planar construction and thus meets the RF-requirements particularly well.

FIGS. 4 and 5 also illustrate a latch cage 1" which is not interrupted in the region of two outwardly bent borders 19 of longitudinal sides 21, which serve as bearing surfaces in the latch hole or aperture 9 (FIG. 2), and can thereby be constructed in a simple and stable design. This stable latch cage construction enables the single contact spring to be pressed (press fit) into a lacquered aperture at the same time as a layer of lacquer in a marginal region 20 of the outwardly bent longitudinal sides 19 is stripped off. A contact can thereby be made between lacquered parts.

In the embodiment of FIGS. 4 and 5, cutouts 22 can be provided in the respective longitudinal sides. A latch boss 23 is preferably disposed in each cutout, extending in an outwardly angled fashion to engage in an edge of the aperture, preventing the latch cage from popping out of the aperture after installation.

Relative to the illustrative embodiments according to FIGS. 1 to 3, a further improvement to the screening effect is brought about by a linear or planar bearing surface in the contact region of the spring 30, 31 against the counterplate, and additionally an improvement to the spring characteristics in order to counteract lasting deformation, where there is a high cup projection, and keep the contact forces in check. The latch cage is improved in terms of stability and the additional requirements of stripping off a layer of lacquer in the case of lacquered surfaces, and of making a metallic contact, are also accomplished.

Although other modifications and changes may be suggested by those skilled in the art, it is the intention of the inventors to embody within the patent warranted hereon all changes and modifications as reasonably and properly come within the scope of their contribution to the art.

We claim:

1. A single contact spring for latch-locking into a sheet-metal aperture of an RF-shielding device, the spring comprising:

a latch cage configured generally in a trough shape and with a lower part having a trapezoidally-shaped cross-section, the latch cage having two open ends and two longitudinal sides, each side having a cutout, the two cutouts opposing each other, top edges of the longitudinal sides being angled-off outward, an angled-off carrier part fastened to one of the ends, and an outwardly bent-off elbow extending from one of the longitudinal sides at one of the cutouts; and a resilient contact part generally configured as a contact cup, the contact part being resiliently held by said angled-off carrier part of the latch cage, the contact part having a hook-shaped part extending therefrom in an opposite-bent manner relative to said bent-off elbow to engage said bent-off elbow when said contact spring is in a normal position, the contact part being positioned generally between the longitudinal sides of the latch cage so that the contact part is disposed partially below a plane defined by said top edges, in the normal position.

2. The single contact spring as claimed in claim 1, wherein the contact cup is generally conical.

3. The single contact spring as claimed in claim 1, wherein the contact cup is generally pyramidal.

4. The single contact spring as claimed in claim 1, wherein the contact part includes a contact region with a domed embossment.

5. The single contact spring as claimed in claim 1, wherein the contact cup is roof-shaped.

6. The single contact spring as claimed in claim 5, wherein the contact cup has two roof slopes, and wherein one of the two roof slopes continues into a convexly curved, resilient carrier part extending over one end of the latch cage and below a base of the latch cage and being connected to the end of the latch cage opposite the extending roof slope, the resilient carrier part running under the base of said latch cage.

7. The single contact spring as claimed in claim 6, wherein a portion of each cutout is formed by a respective tab bent obliquely outward.

8. The single contact spring as claimed in claim 5, wherein the carrier part is fastened to the opposing end of the latch cage by a loop-shaped portion of the carrier part.

9. The single contact spring as claimed in claim 1 wherein the cutouts have latch bosses.

10. A contact spring comprising:

a latch cage configured to snap-fit into an aperture, the latch cage having a bottom and a pair of upwardly bent parallel longitudinal sides, each side having an outwardly-bent top edge;

a contact part;

a resilient carrier part extending from said latch cage to said contact part, said carrier part biasing said contact part generally away from said latch cage so that said contact part is resiliently deflectable toward said bottom;

an L-shaped elbow extending from said latch cage; and a hook part extending from said contact part to normally engage said elbow, limiting movement of said contact part away from said latch cage, but allowing deflection of said contact part toward said latch cage, the contact part being positioned generally between said longitudinal sides of said latch cage so that the contact part is disposed partially below a plane defined by said top edges, in a normal position.

11. The contact spring according to claim 10 wherein said contact part is generally conical and has a domed embossment.

12. The contact spring according to claim 10 wherein said contact part is generally roof-shaped, having two downwardly sloping portions forming a crest directed away from said latch cage.

13. The contact spring according to claim 10 further comprising a pair of latch bosses, each latch boss extending generally outward and upward from sides of said latch cage, said latch bosses being resiliently deflectable and engageable with edges of said aperture to allow insertion of said contact spring into said aperture and resist the removal of said contact spring from said aperture.

14. The contact spring according to claim 10, wherein the carrier part extends from said contact part at a first end, extends below said latch cage in a semicircular fashion, said carrier part joining said latch cage at a second end opposite said first end.

15. The contact spring according to claim 10 wherein said latch cage has two oppositely disposed longitudinal sides, said sides being configured to bias outwardly against said aperture to retain said contact spring therein.

16. A contact spring for an RF-shielding device, said contact spring comprising:

a contact part; and a latch cage, said latch cage being biased away from said contact part by a resilient carrier part joined therebetween, said latch cage being configured to fit into an aperture of said RF-shielding device, wherein said latch cage is generally trough-shaped, said latch cage including:

a pair of oppositely disposed upwardly extending longitudinal sides, said contact part being movably located generally between said sides, said sides being configured to inwardly deflect upon engagement with said aperture so that said latch cage is receivable within said aperture;

a cutout in each side;

a latch boss defined by each said cutout engageable with said aperture to retain said latch cage in said aperture;

a hook means to engage said contact part, said hook means limiting movement of said contact part away from said latch cage, but allowing movement of said contact part toward said latch cage.

17. A contact spring according to claim 16 wherein the hook means includes:

an elbow extending from one of said longitudinal sides at the respective cutout; and a cooperative, oppositely-directed hook-shaped part extending from said contact part positioned to engage said elbow.

18. A contact spring according to claim 16 wherein said contact part has two downwardly sloping portions forming a crest directed away from said lower part of said latch cage, one of said sloping portions being elongated, forming into said carrier part, extending over one end of said latch cage and below a base of said latch cage in a generally semicircular fashion, the carrier part being secured to an opposite end of said latch cage.

19. A contact spring according to claim 16 wherein said contact part includes a conical contact cup.

20. A contact spring according to claim 16 wherein said contact part includes a roof-shaped contact cup.

\* \* \* \* \*